United States Patent
Jeon et al.

(10) Patent No.: US 8,659,464 B2
(45) Date of Patent: Feb. 25, 2014

(54) ANALOG-DIGITAL CONVERTER AND CONVERTING METHOD USING CLOCK DELAY

(75) Inventors: Young-deuk Jeon, Daejeon (KR); Woo Seok Yang, Daejeon (KR); Tae Moon Roh, Daejeon (KR); Jong-Kee Kwon, Daejeon (KR); Jongdae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/593,301

(22) Filed: Aug. 23, 2012

(65) Prior Publication Data

US 2013/0057424 A1    Mar. 7, 2013

(30) Foreign Application Priority Data

Sep. 5, 2011 (KR) .................. 10-2011-0089637

(51) Int. Cl.
*H03M 1/34* (2006.01)
(52) U.S. Cl.
USPC .................................... 341/163; 341/155
(58) Field of Classification Search
USPC .................... 341/144, 155, 163, 156, 172
See application file for complete search history.

(56) References Cited

U.S. PATENT DOCUMENTS

| | | | | |
|---|---|---|---|---|
| 3,781,781 A | * | 12/1973 | Groves, Jr. | 367/155 |
| 4,196,421 A | * | 4/1980 | Decoursey et al. | 370/466 |
| 6,154,164 A | * | 11/2000 | Gross, Jr. | 341/163 |
| 6,828,927 B1 | | 12/2004 | Hurrell et al. | |

OTHER PUBLICATIONS

Ba Ro Saim Sung et al., "A Time-Interleaved Flash-SAR Architecture for High Speed A/D Conversion", ISCAS 2009, 2009, pp. 984-987, IEEE.

* cited by examiner

*Primary Examiner* — Peguy Jean Pierre

(57) ABSTRACT

The present inventive concept relates to an analog-digital converter. The analog-digital converter includes a clock generating unit generating a clock signal; a clock delay adjusting unit outputting one of a first clock signal to a Kth clock signal according to a control signal; a capacitive digital-analog converting unit outputting a difference between the analog signal and a reference signal; a comparison unit judging whether an output of the capacitive digital-analog converting unit is 0, a positive number, or a negative number, in response to an output of the clock delay adjusting unit; and an SAR logic unit transferring an output of the comparison unit to the capacitive digital-analog converting unit in response to an output of the clock delay adjusting unit and performing a successive approximation operation to output the N-bit digital signal.

10 Claims, 9 Drawing Sheets

ANALOG-DIGITAL CONVERTER AND CONVERTING METHOD USING CLOCK DELAY

CROSS-REFERENCE TO RELATED APPLICATIONS

A claim for priority under 35 U.S.C. §119 is made to Korean Patent Application No. 10-2011-0089637 filed Sep. 5, 2011, in the Korean Intellectual Property Office, the entire contents of which are hereby incorporated by reference.

BACKGROUND

The inventive concepts described herein relate to a converter, and more particularly, relate to an analog-digital converter and a converting method thereof In recent years, multifunctional devices such as a mobile communication terminal, a digital camera, an MP3 player, a camcorder, and the like have been become light and small-sized due to their portability. This necessitates a technique of designing a circuit that consumes a minimum power and takes a less area.

Design for high-performance electronic systems has been made using a digital signal processing technique. As a technique for converting an analog signal into a digital signal to be processed at a digital domain, an analog-digital converter (ADC) is required which consumes a minimum power, takes a less area, and provides a rapid sampling rate and a high resolution.

The analog-digital converter converts an analog input signal, expressed by a continuous value, into a digital code value expressed by a discrete amount. The analog-digital converter converts an analog input signal into a digital code value by comparing the analog input signal with a reference voltage signal.

Since a typical Successive Approximation Register (SAR) analog-digital converter is configured to iteratively use a comparator, it is simply in a circuit structure. Since an analog circuit using an amplifier is not included, its circuit area and power consumption are reduced, and its operating voltage is low.

SUMMARY

Example embodiments of the inventive concept provide an analog-digital converter which converts an analog signal into an N-bit digital signal (N being a positive integer). The analog-digital converter comprises a clock generating unit generating a clock signal; a clock delay adjusting unit outputting one of the first clock signal to the Kth clock signal (K being a positive integer of more than 1 and less than N) according to the control signal, the first clock signal being delayed by a first delay time from the clock signal and the Kth clock signal being delayed by a Kth delay time from the clock signal; a capacitive digital-analog converting unit outputting a difference between the analog signal and a reference signal; a comparison unit judging whether an output of the capacitive digital-analog converting unit is 0, a positive number, or a negative number, in response to an output of the clock delay adjusting unit; and an SAR logic unit transferring an output of the comparison unit to the capacitive digital-analog converting unit in response to an output of the clock delay adjusting unit and performing a successive approximation operation to output the N-bit digital signal.

In example embodiments, the N-bit digital signal is divided into K groups from a most significant bit, each of the K groups includes at least one bit, and the clock delay adjusting unit sequentially transfers the first to Kth clock signals to the comparison unit and the SAR logic unit to correspond to the K groups according to the control signal.

In example embodiments, the comparison unit comprises a pre-amplifier amplifying an output of the capacitive digital-analog converting unit in response to an output of the clock delay adjusting unit; and a latch judging whether an output of the pre-amplifier is larger than a zero, in response to an output of the clock delay adjusting unit.

In example embodiments, the clock delay adjusting unit comprises a plurality of delays delaying the clock signal by first to Kth delay times to generate first to Kth clock signals; and a signal selector selecting one of the first to Kth clock signals according to the control signal.

In example embodiments, the signal selector is formed of a multiplexer and the control signal is generated from the SAR logic unit.

In example embodiments, when K is 2, the clock delay adjusting unit outputs one of a first clock signal and a second clock signal to the comparison unit and the SAR logic unit according to the control signal, the first clock signal being generated by delaying the clock signal by a first delay time and the second clock signal being generated by delaying the clock signal by a second delay time.

In example embodiments, the N-bit digital signal is divided into an MSB period including M bits (M being a positive integer of less than N) and an LSB period including (N–M) bits, and the clock delay adjusting unit transfers the first clock signal to the comparison unit and the SAR logic unit at the MSB period and the second clock signal to the comparison unit and the SAR logic unit at the LSB period.

In example embodiments, the clock delay adjusting unit comprises a first delay delaying the clock signal by a first delay time to generate the first clock signal; a second delay delaying the first clock signal by a second delay time to generate the second clock signal; and a signal selector selecting one of the first and second clock signals according to the control signal.

Example embodiments of the inventive concept also provide a method of converting an analog signal into an N-bit digital signal (N being a positive integer). The method comprises generating unit generating a clock signal; delaying the clock signal by delay times to generate a plurality of delay clock signals; outputting a difference value between the analog signal and a reference voltage; judging whether the difference value is larger than a zero, in response to the delay clock signal; and performing a successive approximation operation using the judgment result in response to the delay clock signal to output the N-bit digital signal.

In example embodiments, outputting a difference value between the analog signal and a reference voltage comprises outputting one of a first clock signal to a Kth clock signal (K being a positive integer of more than 1 and less than N) according to the control signal, the first clock signal being delayed by a first delay time from the clock signal and the Kth clock signal being delayed by a Kth delay time from the clock signal.

In example embodiments, outputting one of a first clock signal to a Kth clock signal according to the control signal comprises dividing the N-bit digital signal into K groups from a most significant bit; and sequentially outputting the first to Kth clock signals according to the control signal to correspond to the K groups, respectively.

In example embodiments, sequentially outputting the first to Kth clock signals according to the control signal to correspond to the K groups respectively comprises delaying the clock signal by first to Kth delay times to generate first to Kth clock signals; and selecting one of the first to Kth clock signals according to the control signal.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
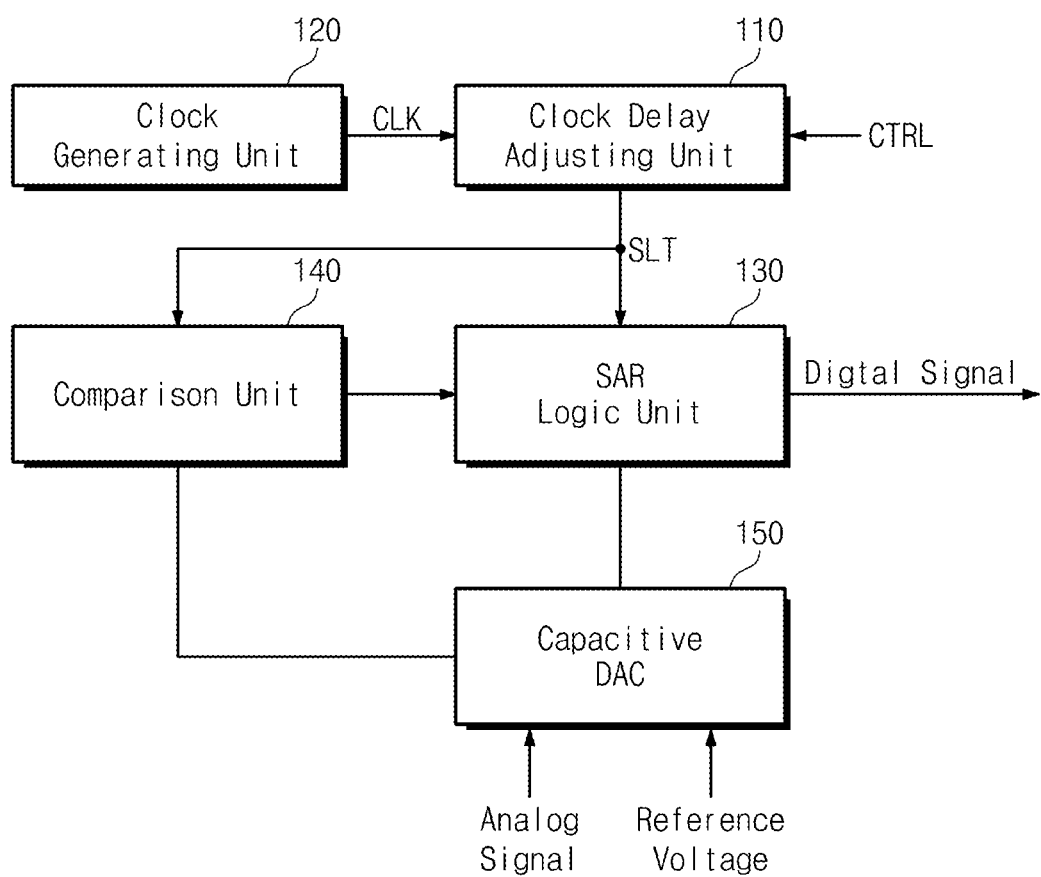
FIG. 1 is a block diagram schematically illustrating an analog-digital converter according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In general, a Successive Approximation Register Analog to Digital Converter (hereinafter, referred to as SAR-ADC) may be configured to iteratively use the same circuit. This may mean that its operating speed is limited to several tens MHz. Two clock techniques may be used to overcome the above-described limitation. One clock technique may be a synchronous clock technique in which there is used an external clock faster than an operating speed of the SAR-ADC. The other clock technique may be an asynchronous clock technique in which a clock is generated by automatically detecting a 1-bit decision moment of a comparator included in the SAR-ADC through an internal circuit of the SAR-ADC.

A clock technique may be advanced into the asynchronous clock technique from the synchronous clock technique. However, although the asynchronous clock technique is applied, an operating speed of the SAR-ADC may be lowered when a signal level is small. With the inventive concept, an operating speed of the SAR-ADC on a small level of signal may be improved by adjusting a delay of a clock signal so as for a conversion time to be shortened.

FIG. 1 is a block diagram schematically illustrating an analog-digital converter according to an embodiment of the inventive concept. Referring to FIG. 1, an analog-digital converter 100 may include a clock delay adjusting unit 110, a clock generating unit 120, an SAR logic unit 130, a comparison unit 140, and a capacitive digital-analog converting unit (hereinafter, referred to as capacitive DAC) 150.

The clock generating unit 120 may generate a clock signal CLK to send it to the clock delay adjusting unit 110. In example embodiments, the clock generating unit 120 may include an asynchronous clock generator (not shown).

A capacitive DAC 150 may receive an analog signal and a reference voltage, and send a difference between an analog signal and a reference voltage to the comparison unit 140.

The comparison unit 140 may receive an output of the capacitive DAC 150 in response to an output SLT of the clock delay adjusting unit 110, and may judge whether the input value is larger than a zero. The comparison unit 140 may output a judgment result to the SAR logic unit 130. In example embodiments, the comparison unit 140 may include a pre-amplifier (not shown) and a latch (not shown). The pre-amplifier may receive and amplify an output of the capacitive DAC 150 to send it to the latch. The latch may receive a signal amplified by the pre-amplifier, and may judge whether an output of the pre-amplifier is larger than a zero, in response to an output of the clock delay adjusting unit 110.

The SAR logic unit 130 may receive an output of the comparison unit 140 in response to the output SLT of the clock delay adjusting unit 110 to send it to the capacitive DAC 150. The SAR logic unit 130 may output an N-bit digital signal through a successive approximation operation.

The clock delay adjusting unit 110 may receive the clock signal CLK generated by the clock generating unit 120 and a control signal CTRL, and may generate a clock signal SLT obtained by delaying the clock signal CLK according to the control signal CTRL. The clock signal SLT may be provided to the comparison unit 140 and the SAR logic unit 130.

In example embodiments, one of a first clock, obtained by delaying the clock signal CLK by a first delay time, to a Kth delay clock, obtained by delaying the clock signal by a Kth delay time, may be sent to the comparison unit 140 and the SAR logic unit 130. Herein, K is an integer of more than 1 and less than N. The reason is that N different clock signals are needed to output an N-bit digital signal using different clock signals respectively applied to N bits and that different clock signals the number of which is less than N are needed when different clock signals are not applied to N bits, respectively. In example embodiments, the control signal CTRL may be generated from the SAR logic unit 130.

Figure 2:
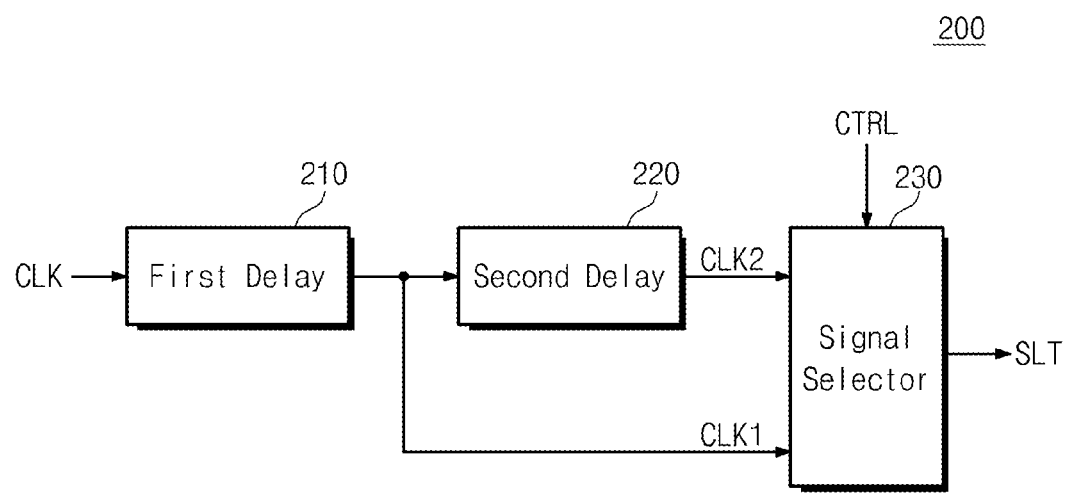
FIG. 2 is a block diagram schematically illustrating a clock delay adjusting unit in FIG. 1.

FIG. 2 is a block diagram schematically illustrating a clock delay adjusting unit in FIG. 1. Referring to FIG. 2, a clock delay adjusting unit 200 may include a first delay 210, a second delay 220, and a signal selector 230.

The first delay 210 may delay a clock signal CLK by a first delay time to output a first clock signal CLK1. The first clock signal CLK1 may be provided to the second delay 220 and the signal selector 230.

The second delay 220 may delay the clock signal CLK by a second delay time to output a second clock signal CLK2. The second clock signal CLK2 may be provided to the signal selector 230.

The signal selector 230 may select one of the first and second clock signals CLK1 and CLK2 in response to a control signal CTRL, and may output the selected clock signal as an output signal SLT of the delay clock generating unit 200.

In the event that conversion is performed under the condition that separate clocks are applied to MSB and LSB periods of a bit of a digital signal, respectively, the signal selector 230 may select the first clock signal CLK1 at the MSB period and the second clock signal CLK2 at the LSB period.

In example embodiments, the signal selector 230 may be formed of a multiplexer. The control signal CTRL may be provided from an SAR logic unit 130 of an analog-digital converter 100.

In case that the clock delay adjusting unit 200 in FIG. 2 is configured to delay a clock signal by a desired delay time and select one of delayed signals, a conventional circuit may further include a multiplexer and an inverter. This configuration may be ignorable compared with a conventional circuit. Thus, it is possible to control a clock signal without additional power consumption and area.

Figure 3:
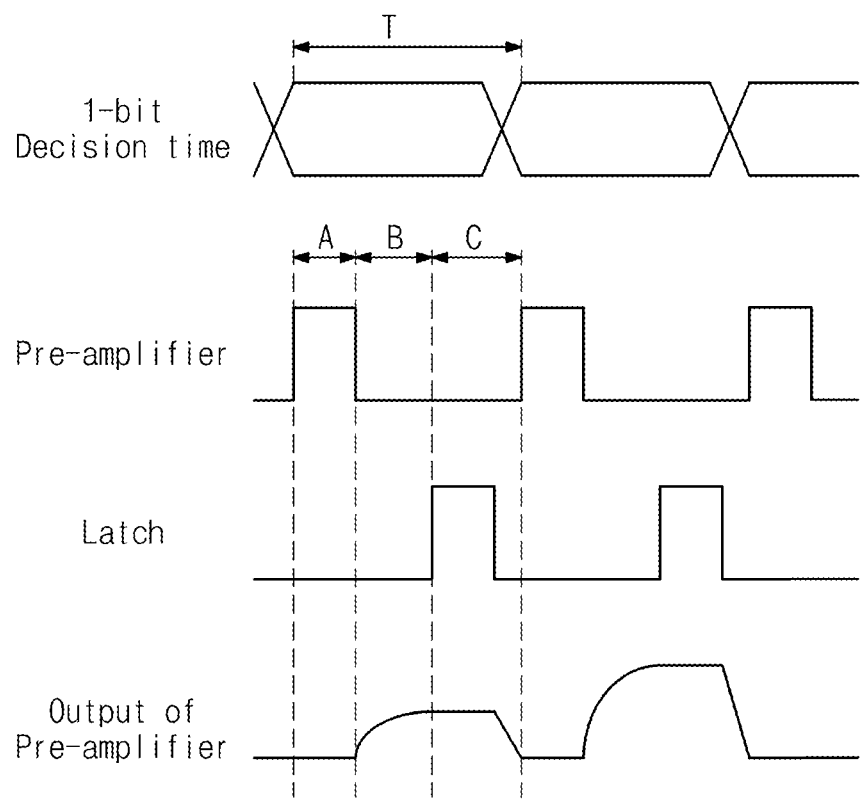
FIG. 3 is a timing diagram illustrating waveforms of a pre-amplifier and a latch included in a comparison unit in FIG. 1.

FIG. 3 is a timing diagram illustrating waveforms of a pre-amplifier and a latch included in a comparison unit in FIG. 1. Referring to FIG. 3, it is assumed that a time taken to decide one bit (hereinafter, referred to as a 1-bit decision time) is T. The 1-bit decision time T may include a pre-amplifier reset time A, a pre-amplifier amplification time B, and a delay time C due to a latch operation and other logics. An operation of an analog-digital converter of the inventive concept will be described with reference to FIGS. 1 to 3.

An analog-digital converter using a successive approximation operation may judge an analog signal input in a binary manner based on a reference voltage. That is, a different value between a reference voltage and an analog signal being an output of a capacitive DAC 150 may be varied according to a code of an SAR logic unit 130. Thus, an output of a pre-amplifier for amplifying a different value between a reference voltage and an analog signal may continue to be varied. In a case where an output value is shifted to a negative value from a positive value, a time taken to convert an input value into an output value may lengthen. The reset time A may be helpful to minimize an operating time of the pre-amplifier, and may be decided at a process or design step.

The delay time C may be decided according to an operating time of the latch and a response speed of other logics. The larger an output of the pre-amplifier, the less the operating time of the latch. The response speed of the other logics may be decided according to a CMOS process. That is, the narrower the minimum feature size of the CMOS logic, the less a delay time of the CMOS logic.

With the above description, the reset time A and the delay time C in the 1-bit decision time T may be decided at a process or design level. Thus, the operating speed of the analog-digital converter may be improved by shortening the pre-amplifier amplification time B.

The pre-amplifier amplification time B may be an amplification time of the pre-amplifier from a time when a reset operation of the pre-amplifier is ended before a time when the latch operates. For ease of description, it is assumed that a magnitude of a signal provided to the pre-amplifier and a bandwidth of the pre-amplifier are fixed. With this assumption, if the amplification time B is sufficiently long (compared with a bandwidth), an output signal of the pre-amplifier may become a signal obtained by multiplying an input signal and an amplification gain of the pre-amplifier. On the other hand, if the amplification time B is short (compared with a bandwidth), an output signal of the pre-amplifier may not obtain a sufficient gain. Thus, a magnitude of a signal may become small compared with the case that the amplification time B is sufficiently long. That is, if a magnitude of a signal provided to the pre-amplifier is large, an output signal of the pre-amplifier may have the same magnitude as a signal multiplied with a sufficient amplification gain though the amplification time B is short.

When an analog signal is converted into a digital signal, a magnitude of a signal provided to the pre-amplifier at an MSB decision period may be larger than that at an LSB decision period. The amplification time B may be decided within a range, in which no error is generated, in the light of the accuracy and operating speed of an analog-digital converter. An output signal multiplied with a sufficient amplification gain may be obtained by deciding the longest time of the amplification time B according to the LSB decision period being such a period that an input signal is small in magnitude. Also, since a magnitude of an input signal at the MSB decision period is larger than that at the LSB decision period, a magnitude of an output signal of the pre-amplifier may be equal to a magnitude multiplied with a sufficient amplification gain though the amplification time B at the MSB decision period is shorter than that at the LSB decision period. In a word, although the amplification time B at the MSB decision period is shorter than that at the LSB decision period, the analog-digital converter may operate normally.

The analog-digital converter according to an embodiment of the inventive concept may be configured to adjust the amplification time B. To adjust the amplification time B, a clock delay adjusting unit 110 may delay a clock signal CLK from a clock generating unit 120 to output a delayed clock signal SLT to a comparison unit 140 and an SAR logic unit 130. That is, a conversion time of the analog-digital converter may be shortened by adjusting the amplification time B. This may mean that an operating speed of the analog-digital converter is improved.

Figure 4:
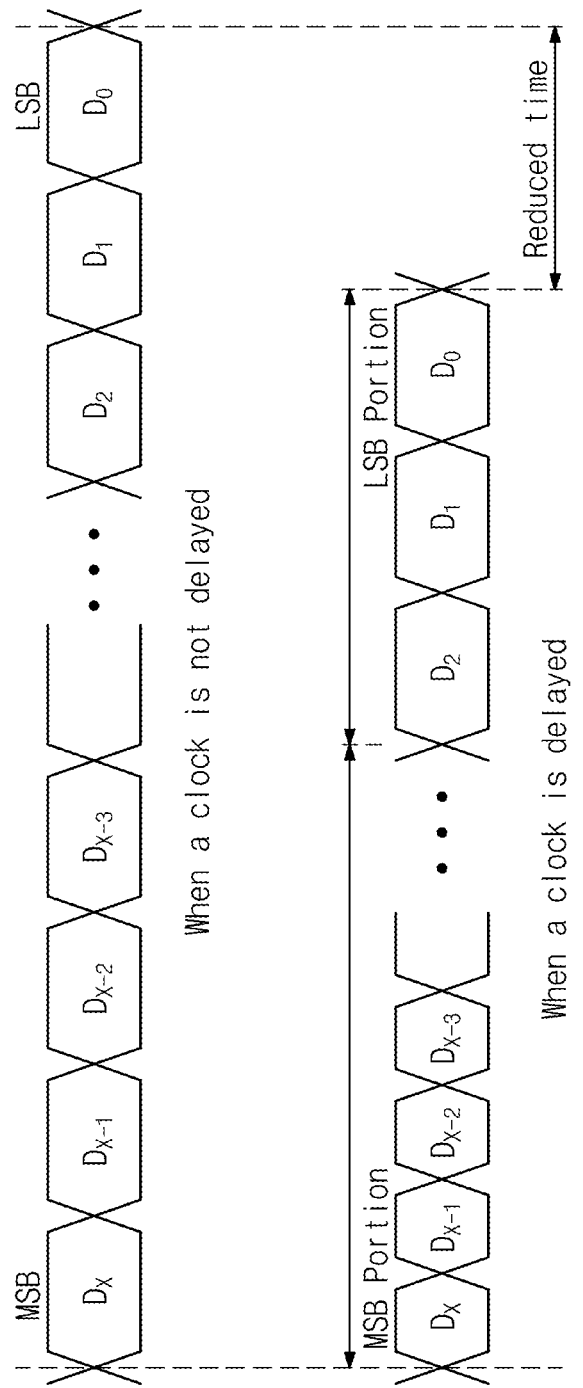
FIG. 4 is a diagram illustrating an output code of a conventional SAR-ADC and an output code of an analog-digital converter of the inventive concept.

FIG. 4 is a diagram illustrating an output code of a conventional SAR-ADC and an output code of an analog-digital converter of the inventive concept. In an SAR-ADC using an asynchronous clock signal, bit decision times of all bits may not be identical to one another. For ease of description, an output code may be illustrated in FIG. 4 under the assumption that bit decision times of all bits are identical to one another.

In the conventional SAR-ADC where a clock is not delayed, the same pre-amplifier amplification time B may be applied to all bits. Thus, a bit decision time at an MSB decision period may be equal to a bit decision time at an LSB decision period. On the other hand, in the analog-digital converter of the inventive concept where a clock is delayed, a bit decision time may be shortened by reducing a bit decision time at an MSB decision period. That is, a bit decision time at the MSB decision period may be shorter than that at the LSB decision period. In FIG. 4, there is illustrated the case that three lower bits are decided during the LSB decision period and the other bits are decided during the MSB decision period. In a case where an analog signal is converted into the same X-bit digital signal, a conversion time of the analog-digital converter of the inventive concept adopting a clock delay adjusting technique may be reduced. Thus, an operating speed of the analog-digital converter of the inventive concept may be improved. The inventive concept is described under the condition that a delayed clock signal is applied to the MSB and LSB decision periods. However, the inventive concept is not limited thereto. For example, the analog-digital converter of the inventive concept can be configured such that different amplification times are applied to clock delays divided by a bit unit (in the case that K is N).

Figure 5:
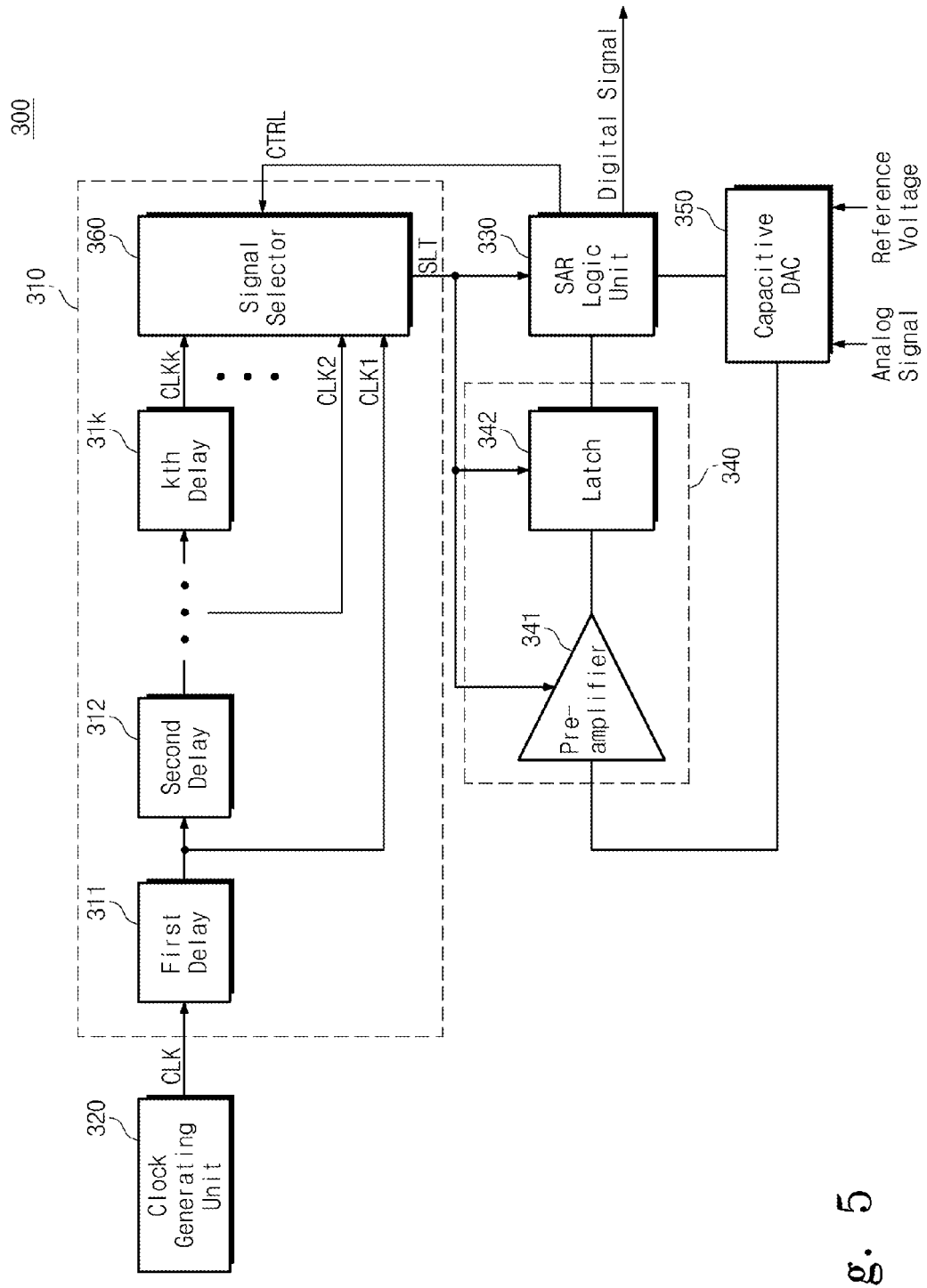
FIG. 5 is a block diagram schematically illustrating constituent elements of an analog-digital converter according to an embodiment of the inventive concept.

FIG. 5 is a block diagram schematically illustrating constituent elements of an analog-digital converter according to an embodiment of the inventive concept. Referring to FIG. 5, an analog-digital converter 300 may include a clock delay adjusting unit 310, a clock generating unit 320, an SAR logic unit 330, a comparison unit 340, and a capacitive DAC 350.

The constituent elements 320, 330, and 350 in FIG. 5 may be substantially the same as those in FIG. 1, and description thereof is thus omitted.

It is assumed that the analog-digital converter 300 outputs an N-bit digital signal. N bits may be divided into K groups from the most significant bit. Each group may include at least one or more bits. Herein, K is an integer of more than 1 and less than N. The reason is that N different clock signals are needed to output an N-bit digital signal using different clock signals respectively applied to N bits and that different clock signals the number of which is less than N are needed when different clock signals are not applied to N bits, respectively.//

The clock delay adjusting unit 310 may include multiple delays 311 to 31$k$ and a signal selector 360.

The first delay 311 may delay a clock signal CLK from the clock generating unit 320 by a first delay time to output a first clock signal CLK1 to the second delay 312 and the signal selector 360.

The second delay 312 may delay the first clock signal CLK1 from the first delay 311 by a second delay time to output a second clock signal CLK2 to a next-stage delay (i.e., a third delay) (not shown) and the signal selector 360. The remaining delays may operate the same as described with reference to the first and second delays 311 and 312 except that the last delay 31$k$ delays a clock signal CLKk-1 from a front-stage delay by a Kth delay time to output a Kth clock signal CLKk to the signal selector 360. In FIG. 5, there is illustrated an example that multiple delays 311 to 31$k$ are connected in series to delay the clock signal CLK generated from the clock generating unit 320. However, the inventive concept is not limited thereto. For example, the clock delay adjusting unit 310 may be configured to include multiple delays connected in parallel to generate different clock signals CLK1 to CLKk. In this case, the clock signal CLK may be provided to the multiple delays, respectively, and the multiple delays may delay the clock signal CLK by corresponding delay times (e.g., first to Kth delay times) to output clock signals CLK1 to CLKk to the signal selector 360.

The signal selector 360 may select one of the clock signals CLK1 to CLKn from the delays 311 to 31$k$ in response to a control signal CTRL, and may output the selected clock SLT to the comparison unit 340 and the SAR logic unit 330. For example, one SLT of the clock signals CLK1 to CLKn from the delays 311 to 31$k$ may be sequentially provided to the comparison unit 340 and the SAR logic unit 330 to correspond to K periods. This may be made to adjust an amplification time B as described with reference to FIGS. 3 and 4. For example, the first clock signal CLK1 delayed by the shortest delay time may be provided to the comparison unit 340 and the SAR logic unit 330 at an MSB decision period. From a next period until an LSB decision period, clock signals CLK2 to CLKk provided to the comparison unit 340 and the SAR logic unit 330 may be signals that are sequentially delayed by delay times being gradually increased until the LSB decision period. As a result, the clock signal CLKk delayed by the longest delay time may be provided to the comparison unit 340 and the SAR logic unit 330 at the LSB decision period. The signal selector 360 may include a multiplexer for selecting one of input clock signals CLK1 to CLKk. A control signal CTRL may be generated by the SAR logic unit 330.

The comparison unit 340 may include a pre-amplifier 341 and a latch 342. The pre-amplifier 341 may amplify a difference between a reference voltage and an analog signal being an output of the capacitive DAC 350 to output it to the latch 342. The latch 342 may judge whether an output of the pre-amplifier 341 is larger than a zero, in response to the output SLT of the clock delay adjusting unit 310. The pre-amplifier 341 and the latch 342 may operate responsive to the clock signal SLT from the signal selector 360. That is, the pre-amplifier 341 and the latch 342 may operate responsive to the first clock signal CLK1 at the MSB decision period and the Kth clock signal CLKk at the LSB decision period.

The clock delay adjusting unit 310 may be formed of a multiplexer and inverters, for example. The clock delay adjusting unit 310 of the analog-digital converter may be ignorable in size. Thus, an operating speed of the analog-digital converter may be improved without additional power and area consumption. Also, it may be more effective when the resolution is high.

Figure 6:
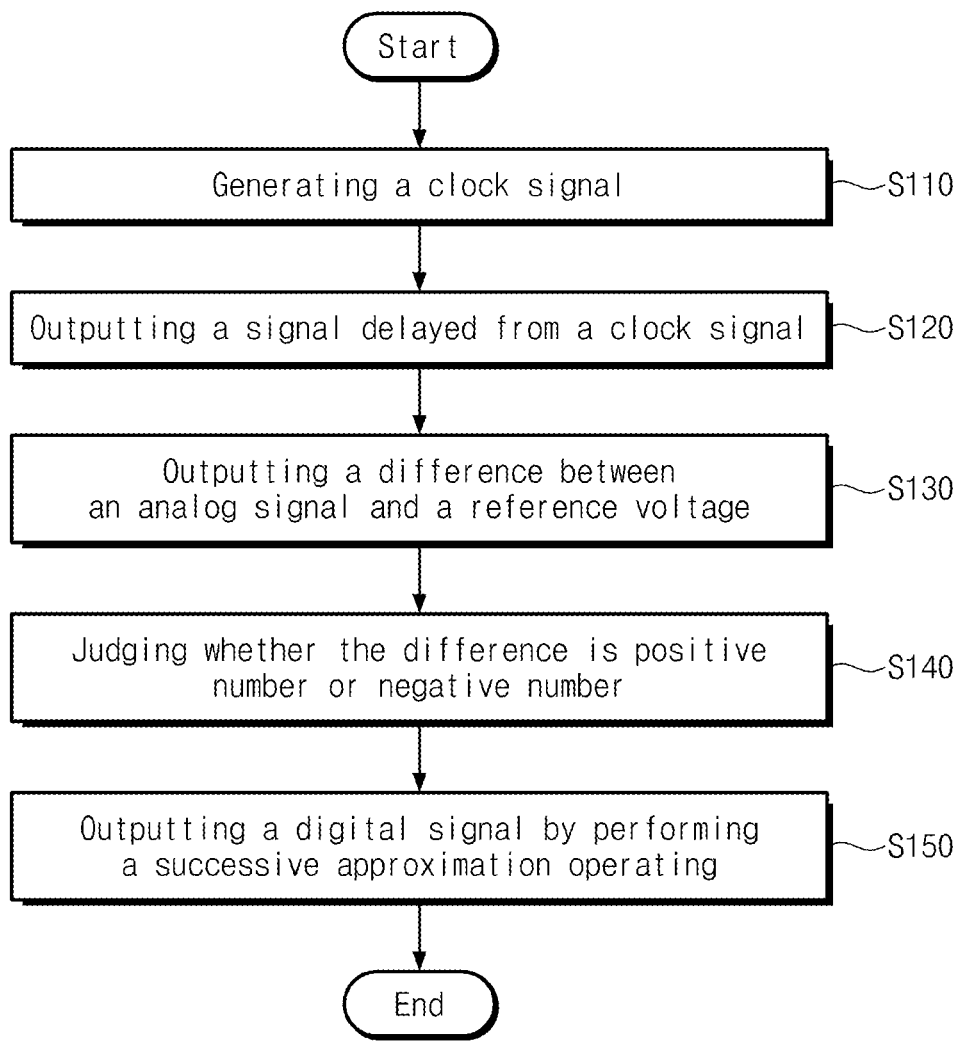
FIG. 6 is a flowchart illustrating an analog-digital converting method according to an embodiment of the inventive concept.

FIG. 6 is a flowchart illustrating an analog-digital converting method according to an embodiment of the inventive concept. Referring to FIG. 6, an analog signal may be converted into an N-bit digital signal (N being a positive integer) through operations S110 to S150.

In operation S110, a clock signal may be generated. The clock signal may be an asynchronous clock signal.

In operation S120, a plurality of delay clock signals may be generated by delaying the clock signal by separate constant times, respectively. For example, one of a first clock signal, obtained by delaying the clock signal by a first delay time, to a Kth clock signal, obtained by delaying the clock signal by a Kth delay time (K being a positive integer of more than 1 and less than N), may be output according to a control signal. The operation S120 will be more fully described with reference to FIGS. 7 and 8.

In operation S130, a difference between an analog signal and a reference voltage may be output.

In operation S140, whether the difference obtained in operation S130 is larger than a zero may be judged in response to a delay clock signal generated in operation S120. That is, the difference value may be judged to be positive or negative.

In operation S150, an N-bit digital signal may be output by performing a successive approximation operation using the judgment result in response to a delay clock signal generated in operation S120.

Figure 7:
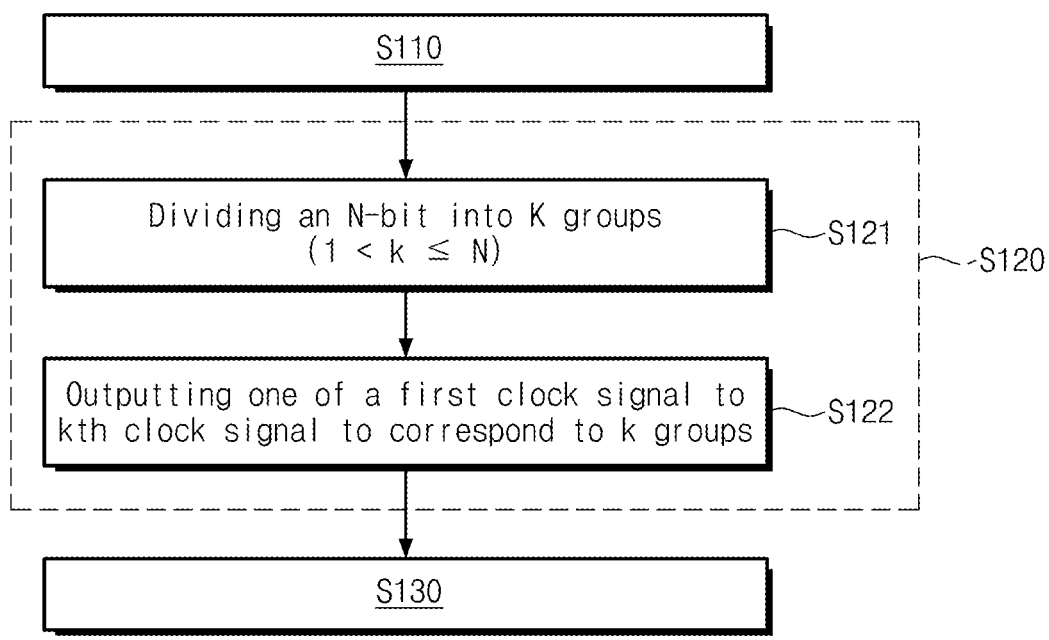
FIG. 7 is a flowchart illustrating an operation S120 in FIG. 6.

FIG. 7 is a flowchart illustrating an operation S120 in FIG. 6.

Referring to FIG. 7, in operation S121, an N-bit digital signal may be divided into K groups. Herein, K is a positive integer of more than 1 and less than N. The reason is that N different clock signals are needed to output an N-bit digital signal using different clock signals respectively applied to N bits and that different clock signals the number of which is less than N are needed when different clock signals are not applied to N bits, respectively.

In operation S122, the clock signals CLK1 to CLKk may be sequentially output according to the control signal to correspond to the K groups, respectively. This may be made to adjust an amplification time B as described with reference to FIGS. 3 and 4. For example, the first clock signal CLK1 delayed by the shortest delay time may be output at an MSB decision period. Clock signals CLK2 to CLKk output from a next period until an LSB decision period may be signals that are sequentially delayed by delay times being gradually increased until the LSB decision period. As a result, the clock signal CLKk delayed by the longest delay time may be provided to the comparison unit 340 and the SAR logic unit 330 at the LSB decision period.

Figure 8:
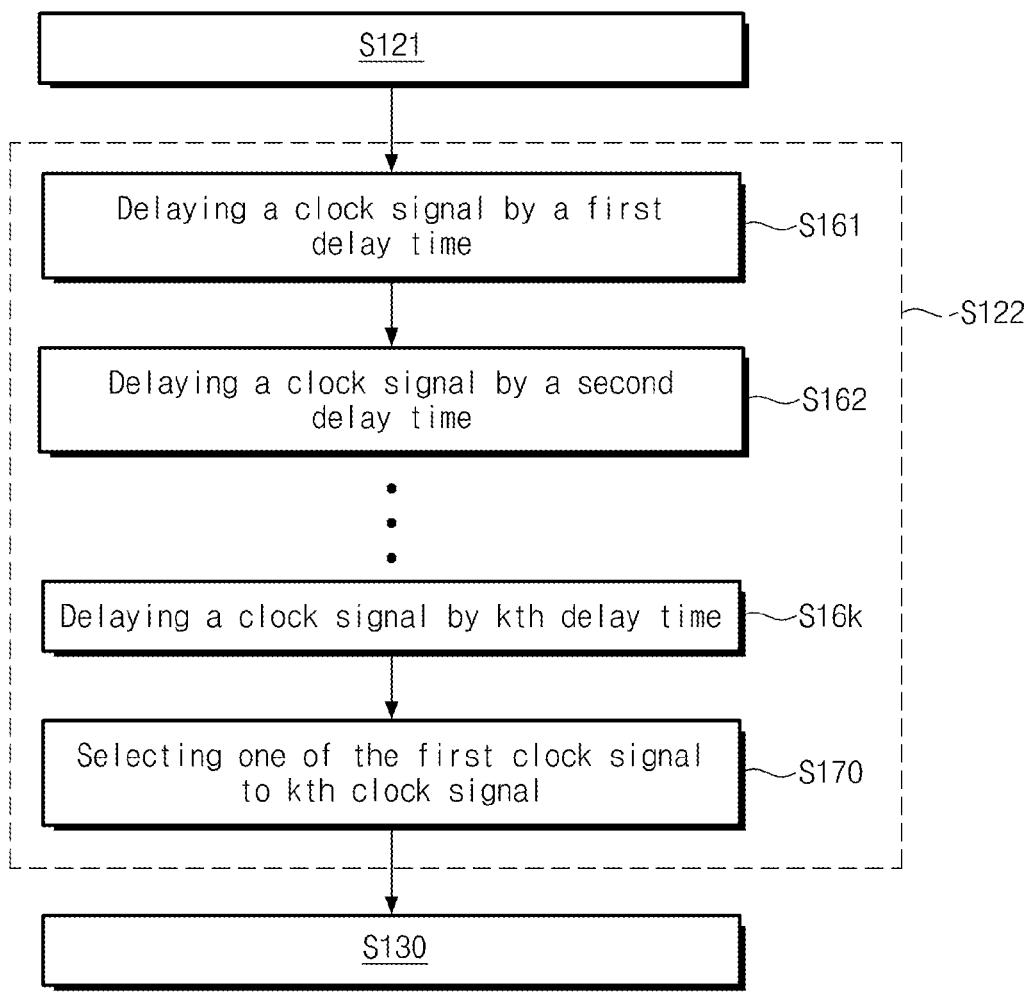
FIG. 8 is a flowchart illustrating an operation S122 in FIG. 7.

FIG. 8 is a flowchart illustrating an operation S122 in FIG. 7.

A clock signal generated in operation S110 may be delayed at operations S161 to S16k, respectively. In detail, at operation S161, a first clock signal may be generated by delaying a clock signal generated in operation S110 by a first delay time. At operation S162, a second clock signal may be generated by delaying the clock signal generated in operation S110 by a second delay time. At operation S16k, a Kth clock signal may be generated by delaying the clock signal generated in operation S110 by a kth delay time.

In operation S170, one of the clock signals generated in operations S161 to S16k may be selected according to a control signal.

The analog-digital converting method described with reference to FIGS. 6 to 8 may use the condition that a magnitude of a signal provided to a pre-amplifier at an MSB decision period is generally larger than that at an LSB decision period. A conversion time may be shortened by adjusting a pre-amplifier amplification time B. Thus, an operating speed of an analog-digital converter of the inventive concept may be improved.

Figure 9:
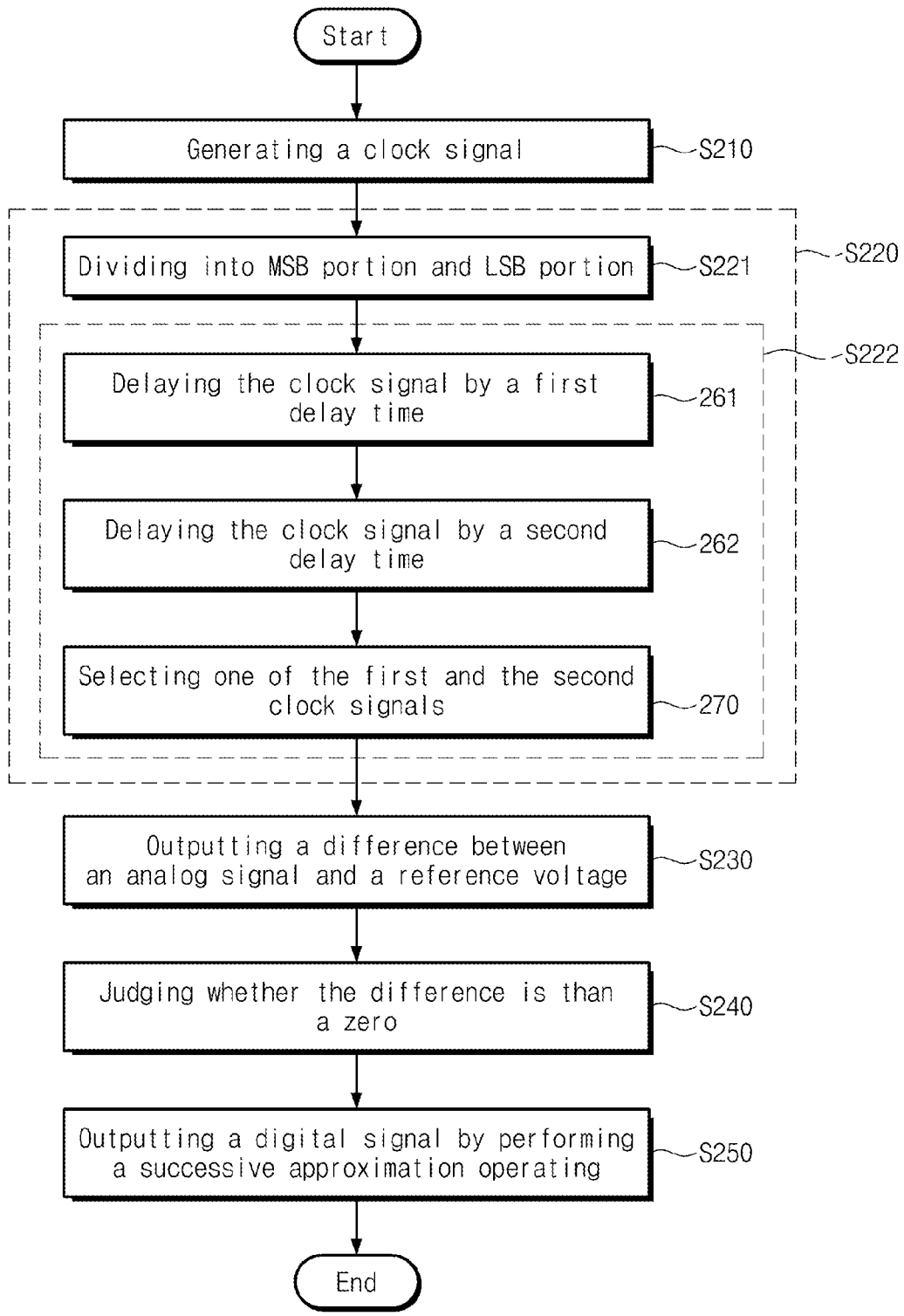
FIG. 9 is a flowchart illustrating an analog-digital converting method of the inventive concept when K is 2.

FIG. 9 is a flowchart illustrating an analog-digital converting method of the inventive concept when K is 2.

Operations S210, S230, S240, and S250 other than operation S220 have been described with reference to FIGS. 6 to 8, and description thereof is thus omitted.

In operation S221, an N-bit digital signal may be divided into an MSB portion including M bits from the most significant bit and an LSB portion including (N−M) bits.

In operation S222, multiple clock signals may be sequentially output according to a control signal to correspond to K groups.

In operation S261, a first clock signal may be generated by delaying a clock signal generated in operation S110 by a first delay time. In operation S262, a second clock signal may be generated by delaying the clock signal generated in operation S110 by a second delay time.

In operation S270, one of the first and second clock signals may be selected according to the control signal.

The analog-digital converting method described with reference to FIG. 9 may be an example of an analog-digital converting method described with reference to FIGS. 6 to 8 when K is 2. The analog-digital converting method described with reference to FIG. 9 may use the condition that a magnitude of a signal provided to a pre-amplifier at an MSB decision period is generally larger than that at an LSB decision period. A conversion time may be shortened by adjusting a pre-amplifier amplification time B. Thus, an operating speed of an analog-digital converter of the inventive concept may be improved.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. An analog-digital converter which converts an analog signal into an N-bit digital signal (N being a positive integer), comprising:
a clock generating unit generating a clock signal;
a clock delay adjusting unit outputting one of a first clock signal to a Kth clock signal (K being a positive integer of more than 1 and less than N) according to a control signal, the first clock signal being delayed by a first delay time from the clock signal and the Kth clock signal being delayed by a Kth delay time from the clock signal;

a capacitive digital-analog converting unit receiving the analog signal and a reference signal and outputting a difference between the analog signal and the reference signal;

a comparison unit judging whether an output of the capacitive digital-analog converting unit is 0, a positive number, or a negative number, in response to an output of the clock delay adjusting unit; and an SAR logic unit transferring an output of the comparison unit to the capacitive digital-analog converting unit in response to an output of the clock delay adjusting unit and performing a successive approximation operation to output the N-bit digital signal, wherein the N-bit digital signal is divided into K groups from a most significant bit, each of the K groups includes at least one bit, and the clock delay adjusting unit sequentially transfers one of the first to Kth clock signals according to the control signal to the comparison unit and the SAR logic unit to correspond to the K groups according to the control signal.

2. The analog-digital converter of claim 1, wherein the comparison unit comprises:

a pre-amplifier amplifying an output of the capacitive digital-analog converting unit in response to an output of the clock delay adjusting unit; and a latch judging whether an output of the pre-amplifier is larger than a zero, in response to an output of the clock delay adjusting unit.

3. The analog-digital converter of claim 1, wherein the clock delay adjusting unit comprises:

a plurality of delays delaying the clock signal by first to Kth delay times to generate first to Kth clock signals;

a signal selector selecting one of the first to Kth clock signals according to the control signal.

4. The analog-digital converter of claim 3, wherein the signal selector is formed of a multiplexer and the control signal is generated from the SAR logic unit.

5. The analog-digital converter of claim 1 wherein when K is 2, the clock delay adjusting unit outputs one of a first clock signal and a second clock signal to the comparison unit and the SAR logic unit according to the control signal, the first clock signal being generated by delaying the clock signal by a first delay time and the second clock signal being generated by delaying the clock signal by a second delay time.

6. The analog-digital converter of claim 5, wherein the N-bit digital signal is divided into an MSB period including M bits (M being a positive integer of less than N) and an LSB period including (N-M) bits, and the clock delay adjusting unit transfers the first clock signal to the comparison unit and the SAR logic unit at the MSB period and the second clock signal to the comparison unit and the SAR logic unit at the LSB period.

7. The analog-digital converter of claim 6, wherein the clock delay adjusting unit comprises:

a first delay outputting the clock signal delayed by a first delay time to generate the first clock signal;

a second delay outputting the first clock signal delayed by a second delay time to generate the second clock signal; and a signal selector selecting one of the first and second clock signals according to the control signal.

8. A method of converting an analog signal into an N-bit digital signal (N being a positive integer), comprising:

generating a clock signal;

outputting a plurality of delay clock signals being delayed by delay times from the clock signal;

outputting a difference value between the analog signal and a reference voltage;

judging whether the difference value is larger than a zero, in response to the delay clock signal; and performing a successive approximation operation using the judgment result in response to the delay clock signal to output the N-bit digital signal, wherein outputting a difference value between the analog signal and a reference voltage comprises outputting one of a first clock signal to a Kth clock signal (K being a positive integer of more than 1 and less than N) according to the control signal, the first clock signal being delayed by a first delay time from the clock signal and the Kth clock signal being delayed by a Kth delay time from the clock signal.

9. The method of claim 8, wherein outputting one of a first clock signal to a Kth clock signal according to the control signal comprises:

dividing the N-bit digital signal into K groups from a most significant bit; and sequentially outputting the first to Kth clock signals according to the control signal to correspond to the K groups.

10. The method of claim 9, wherein sequentially outputting the first to Kth clock signals according to the control signal to correspond to the K groups respectively comprises:

delaying the clock signal by first to Kth delay times to generate first to Kth clock signals; and selecting one of the first to Kth clock signals according to the control signal.

* * * * *